United States Patent [19]
Bui

[11] Patent Number: 6,163,049
[45] Date of Patent: Dec. 19, 2000

[54] METHOD OF FORMING A COMPOSITE INTERPOLY GATE DIELECTRIC

[75] Inventor: Nguyen Duc Bui, San Jose, Calif.

[73] Assignee: Advanced Micro Devices, Inc., Sunnyvale, Calif.

[21] Appl. No.: 09/170,061

[22] Filed: Oct. 13, 1998

[51] Int. Cl.[7] .................................................. H01L 29/72
[52] U.S. Cl. .......................... 257/321; 257/324; 257/637; 257/640
[58] Field of Search .................................... 257/321, 324, 257/637, 640

[56] References Cited

U.S. PATENT DOCUMENTS 5,907,183 5/1999 Takeuchi ................................ 257/324

*Primary Examiner*—Edward Wojciechowicz

[57] ABSTRACT

The as-deposited thickness of at least one of the oxide layers of a composite ONO dielectric film between a floating gate and a control gate of a non-volatile semiconductor device is deposited to a sufficient thickness such that, after the top oxide layer is cleaned, the control gate is spaced apart from the floating gate a distance corresponding to at least a minimum design data retention. Deposition is facilitated by forming one or more oxide layers at a thickness greater than the design rule by employing a relatively high dielectric constant material for the oxide layer or layers, such as aluminum oxide, titanium oxide or tantalum oxide. In this way, the capacitance of the ONO film between the floating gate and the control gate is maintained per design rule, avoiding a change in operating voltage. Embodiments include depositing a relatively thick top oxide layer to enable thorough cleaning without adversely reducing the total thickness of the ONO stack and, hence, achieving design data retention.

5 Claims, 3 Drawing Sheets

METHOD OF FORMING A COMPOSITE INTERPOLY GATE DIELECTRIC

FIELD OF THE INVENTION

The present invention relates to a method of manufacturing a memory device on a semiconductor substrate. The present invention has particular applicability in manufacturing nonvolatile semiconductor memory devices requiring a high-quality dielectric layer between a floating gate and a control gate.

BACKGROUND ART

Conventional nonvolatile semiconductor memories, such as flash electrically erasable programmable read only memories (flash EEPROMs), typically comprise a floating gate memory cell, which includes a source region, a drain region and a channel region formed in a semiconductor substrate, and a floating gate formed above the substrate between the channel region and a control gate. A voltage differential is created in the cell when a high voltage is applied to the control gate while the channel region is kept at a low voltage. This voltage difference causes electrons to move from the channel region to the floating gate through a phenomenon known as tunneling, thus charging the floating gate. This movement of electrons is referred to as programming.

FIG. 1 depicts a typical flash memory cell, wherein a pair of source/drain regions 20 and a channel region 30 are formed in a semiconductor substrate 10. A floating gate 50 is formed, usually of polysilicon, above the channel region 30, with a tunnel oxide layer 40 in between. A dielectric film 60, known as an "ONO layer" comprising a bottom silicon oxide layer 61, a silicon nitride layer 62 and a top silicon oxide layer 63, is typically formed on top of the floating gate 50. After formation of the top oxide layer 63, it is cleaned, as by chemical cleaning, typically employing an acid or by plasma techniques. A polysilicon control gate 70 is then formed on top oxide layer 63, followed by formation of a tungsten silicide (WSi) contact layer 80.

The top oxide layer 63 is typically relatively thin, for example, about 55 Å or less, and becomes even thinner due to the chemical cleaning procedure. If the top oxide layer is thinned excessively, the distance between the floating gate 50 and the subsequently formed control gate 70 is sufficiently reduced to adversely affect the performance of the finished device, particularly the "data retention" of the flash memory; i.e., the length of time the floating gate 50 is able to store a charge. Data retention is a function of the thickness of the ONO film 60. The current industry standard for data retention of a flash memory cell is 100,000 hours (about 11.4 years). However, if the top oxide layer 63 is reduced by greater than about 10% below the design rule for the semiconductor device, leakage will occur from the floating gate 50 to the control gate 70, thereby decreasing device data retention below the standard. Thus, the tolerance for error in the processing of the top oxide layer 63 (its "process window"), especially during the cleaning process, is extremely narrow.

Furthermore, the problem of excessive thinning of the top oxide 63 becomes even more critical on scaling the device to smaller dimensions, in response to the increasing demand for miniaturization of electronic components and reduction of the power requirements of flash memory devices. As the flash memory is scaled down, and the thickness of the ONO film 60 is correspondingly reduced, deposition of its component oxide layers 61, 63 is more difficult to control due to inherent limitations of the deposition process, which results in oxide layers of lesser quality.

There exists a need for a method of manufacturing a composite dielectric layer of a flash memory device without reducing the data retention of the finished device below design requirements. There also exists a continuing need for a method of manufacturing a composite interpoly dielectric layer with improved control and greater accuracy.

SUMMARY OF THE INVENTION

An advantage of the present invention is a method of manufacturing a composite interpoly dielectric layer of a nonvolatile semiconductor memory device without reducing device performance.

Additional advantages and other features of the present invention will be set forth in part in the description which follows and in part will become apparent to those having ordinary skill in the art upon examination of the following or may be learned from the practice of the present invention. The objects and advantages of the present invention may be realized and obtained as particularly pointed out in the appended claims.

According to the present invention, the foregoing and other advantages are achieved in part by a method of manufacturing a semiconductor device having a floating gate formed on a channel region of a semiconductor substrate and a control gate formed above the floating gate spaced apart from the floating gate a distance corresponding to at least a minimum design data retention, which method comprises depositing a first oxide dielectric layer on the floating gate at a first thickness; depositing a nitride dielectric layer on the first oxide dielectric layer at a second thickness; depositing a second oxide dielectric layer on the nitride dielectric layer at a third thickness; cleaning the second oxide dielectric layer, thereby reducing the third thickness to a fourth thickness less than the third thickness; and forming the control gate on the second oxide dielectric layer having the fourth thickness.

Another aspect of the present invention is a method of manufacturing a semiconductor device, which method comprises forming a tunnel oxide layer on a channel region in a semiconductor substrate; forming a polysilicon floating gate on the tunnel oxide layer; depositing a silicon dioxide layer on the floating gate at a first thickness; depositing a silicon nitride layer on the silicon dioxide layer at a second thickness; depositing an oxide layer having a dielectric constant greater than silicon dioxide at a third thickness; chemically cleaning the oxide layer, thereby reducing the third thickness to a fourth thickness less than the third thickness; and forming a polysilicon control gate on the oxide layer; wherein: the sum of the first, second and fourth thicknesses corresponds to at least a minimum design data retention; and the silicon oxide layer, silicon nitride layer and oxide layer have a combined capacitance corresponding to the design rule of the semiconductor device.

A still further aspect of the present invention is a semiconductor device comprising a tunnel oxide layer on a channel region of a semiconductor substrate;
a floating gate on the tunnel oxide layer; a control gate formed above the floating gate and spaced apart from the floating gate at least a predetermined distance; and a composite dielectric layer between the control gate and the floating gate, the dielectric layer comprising: a first oxide layer on the floating gate, the first oxide layer having a first thickness; a nitride layer on the first oxide layer, the nitride layer having a second thickness; and a second oxide layer having a dielectric constant about equal to or greater than 10 and having a third thickness; wherein the sum of the first, second and third thicknesses corresponds to at least a minimum design data retention; and wherein the first and second oxide layers and the nitride layer have a combined capacitance corresponding to the design rule of the semiconductor device.

Additional advantages of the present invention will become readily apparent to those skilled in this art from the following detailed description, wherein only the preferred embodiment of the present invention is shown and described, simply by way of illustration of the best mode contemplated for carrying out the present invention. As will be realized, the present invention is capable of other and different embodiments, and its several details are capable of modifications in various obvious respects, all without departing from the present invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent like elements throughout, and wherein.

DESCRIPTION OF THE INVENTION

The present invention addresses and solves problems stemming from thinning of a dielectric layer, between the floating and control gates of a flash memory device, during cleaning. A reduction in the thickness of such an interpoly dielectric layer adversely affects the performance of the finished device, such as the data retention of the flash memory device, and increases the difficulty of scaling the device for miniaturization and reduction of power consumption.

According to the methodology of the present invention, at least one of the oxide layers of a composite ONO stack between the floating and control gates is deposited at a sufficient thickness such that, after cleaning, the control gate is spaced apart from the floating gate by a distance corresponding to at least a minimum design data retention. Thus, the thickness of one or both oxide layers is selected such that the original as deposited thickness of the composite ONO stack exceeds the design requirements to allow for a reduction in overall ONO thickness due to cleaning. Another technical advantage of the present invention is that process flexibility is increased without adversely affecting device performance. Specifically, the oxide layer or layers can be ultimately formed at a thickness in excess of design requirements while maintaining electrical characteristics by forming such thick oxide layers of a material having a relatively high dielectric constant, such as aluminum oxide, titanium oxide or tantalum oxide. In this way, the capacitance of the composite ONO film between the floating gate and the control gate is maintained per the design rule of the device. Consequently, the operating voltage of the device does not change, even though the thickness of the composite ONO stack is greater than the design rule, thereby advantageously enhancing deposition flexibility and hence, facilitating the overall deposition process.

Embodiments of the present invention comprise providing a relatively thick top oxide layer of the composite ONO stack, thereby enabling the top layer to be cleaned thoroughly without reducing the total thickness of the composite ONO stack to the point of adversely affecting device data retention. By depositing the top oxide layer at a thickness exceeding the design rule, it can be thoroughly cleaned and undergo a thickness reduction without adversely affecting device data retention. Thus, the present invention advantageously enables widening of the cleaning window and increasing process flexibility. In addition, by depositing one or more relatively thick oxide layers, process control is facilitated, thereby enabling cost-effective device scaling.

Figure 1:
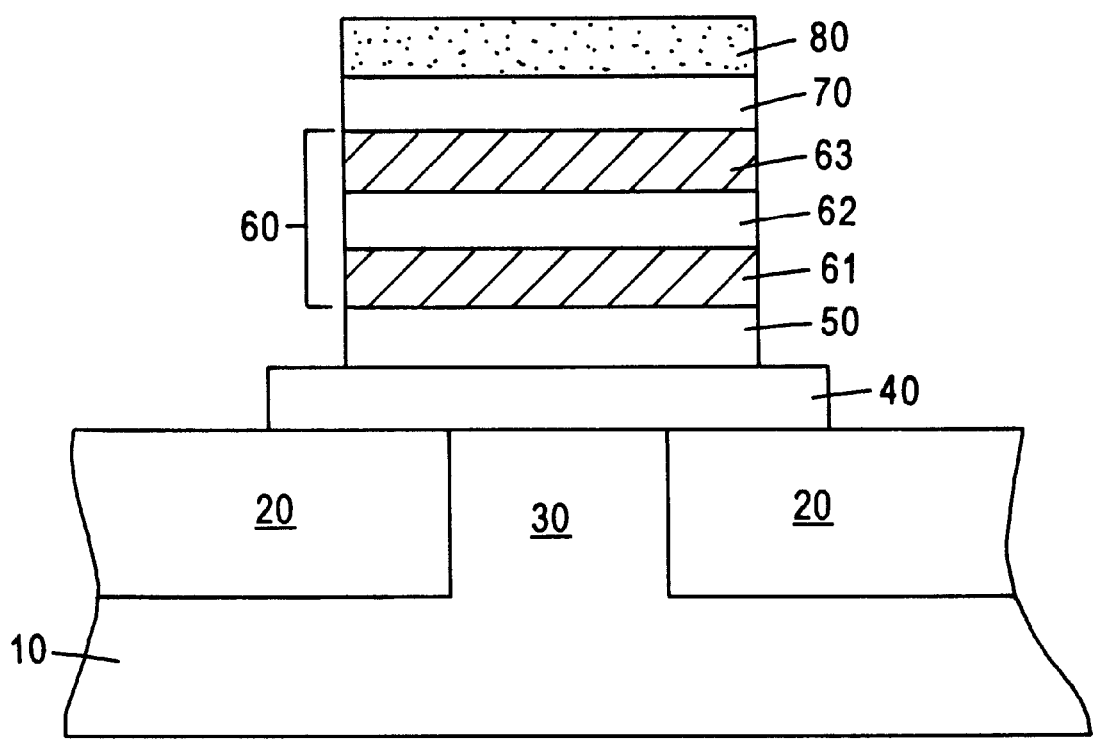
FIG. 1 is a cross-sectional view of a flash memory cell produced by conventional techniques.
Figure 2:
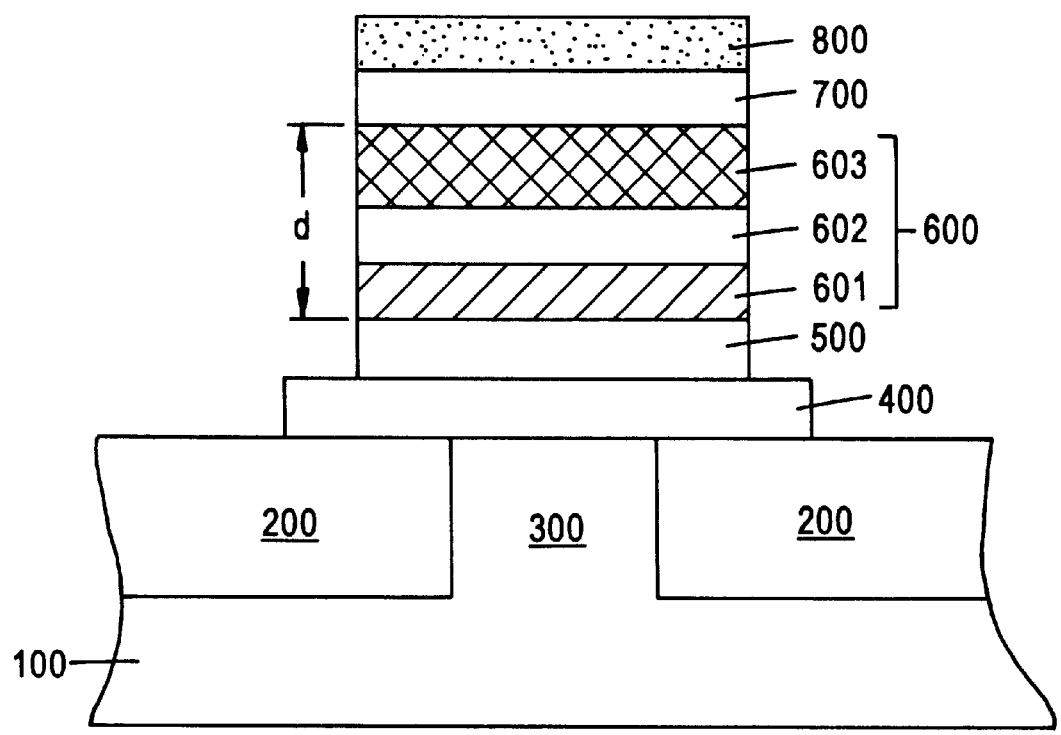
FIG. 2 is a cross-sectional view of a flash memory cell produced in accordance with the methodology of a first embodiment of the present invention.

A semiconductor device according to an embodiment of the present invention is illustrated in FIG. 2. A pair of source/drain regions 200 and a channel region 300 are formed in a semiconductor substrate 100, such as by implantation of impurities. As used throughout the present disclosure and claims, the term "substrate" denotes a semiconductor substrate or an epitaxial layer formed on the semiconductor substrate. A tunnel oxide layer 400 is formed over the channel region 300, as by thermal oxidation. A first polysilicon layer, which will form a floating gate 500, is then formed on tunnel oxide layer 400, as by low-pressure chemical vapor deposition (LPCVD), then masked and etched. A composite ONO film stack 600 is thereafter formed on floating gate 500 by sequentially depositing a first oxide layer 601, such as silicon dioxide by low pressure chemical vapor deposition (LPCVD), a silicon nitride layer 602, and finally a second oxide layer 603 comprising a material with a dielectric constant greater than that of silicon dioxide; e.g., greater than about 10, such as aluminum oxide, titanium oxide, or tantalum oxide. The second oxide layer 603 is then cleaned, as by chemical cleaning, thereby reducing its thickness. A second polysilicon layer is then formed, as by LPCVD, on second oxide layer 603, masked and etched to form control gate 700 and to complete formation of floating gate 500. A contact layer 800, such as titanium silicide, tungsten silicide, or cobalt silicide is subsequently formed on control gate 700.

The thickness of the composite ONO film 600 (i.e., the distance d between the floating gate 500 and the control gate 600) corresponds to at least a minimum design data retention, and is the sum of the thicknesses of the first oxide layer 601, the nitride layer 602 and the reduced second oxide layer 603. To ensure that the total thickness of the composite ONO film 600 does not fall below a minimum design data retention value due to cleaning, the second oxide layer 603 is deposited at a sufficiently large thickness to allow for thickness reduction upon cleaning; e.g., greater than the 55 Å thickness to which this layer is deposited in conventional ONO formation techniques.

The composite ONO film 600 formed in accordance with the present invention exhibits a predetermined capacitance between floating gate 500 and control gate 700 according to the design rule of the flash memory device. The capacitance of stacked ONO film 600 is the combined capacitance of its three constituent layers 601, 602, 603 and, therefore, is dependent upon the thickness of each layer. Since the thickness of the final composite ONO stack of the present invention can be greater than the design rule contemplating silicon-dioxide as the oxide layers, it is advantageous to form at least one of the layers of a material having a relatively high dielectric constant to satisfy the design capacitance. For example, if the thickness of the second oxide layer 603 is increased according to the present invention, while the silicon dioxide layer 601 and silicon nitride layer 602 are deposited to thicknesses in accordance with conventional techniques, a material with a greater dielectric constant than silicon dioxide, such as aluminum oxide, titanium oxide or tantalum oxide, is employed for the second oxide layer 603. For example, a conventional second oxide layer 603 of silicon dioxide has a thickness of about 55 Å and a dielectric constant of about 3.9; whereas, according to embodiments of the present invention, aluminum oxide having a dielectric constant of about 10 with a final thickness of about 145 Å to about 160 Å would have to be deposited. Alternatively, a layer of titanium oxide having a dielectric constant of about 40 could be deposited to a thickness of about 575 Å to about 585 Å, or a layer of tantalum oxide having a dielectric constant of about 25 could be deposited to a thickness of 365 Å to about 380 Å to accomplish the same result.

Figure 3:
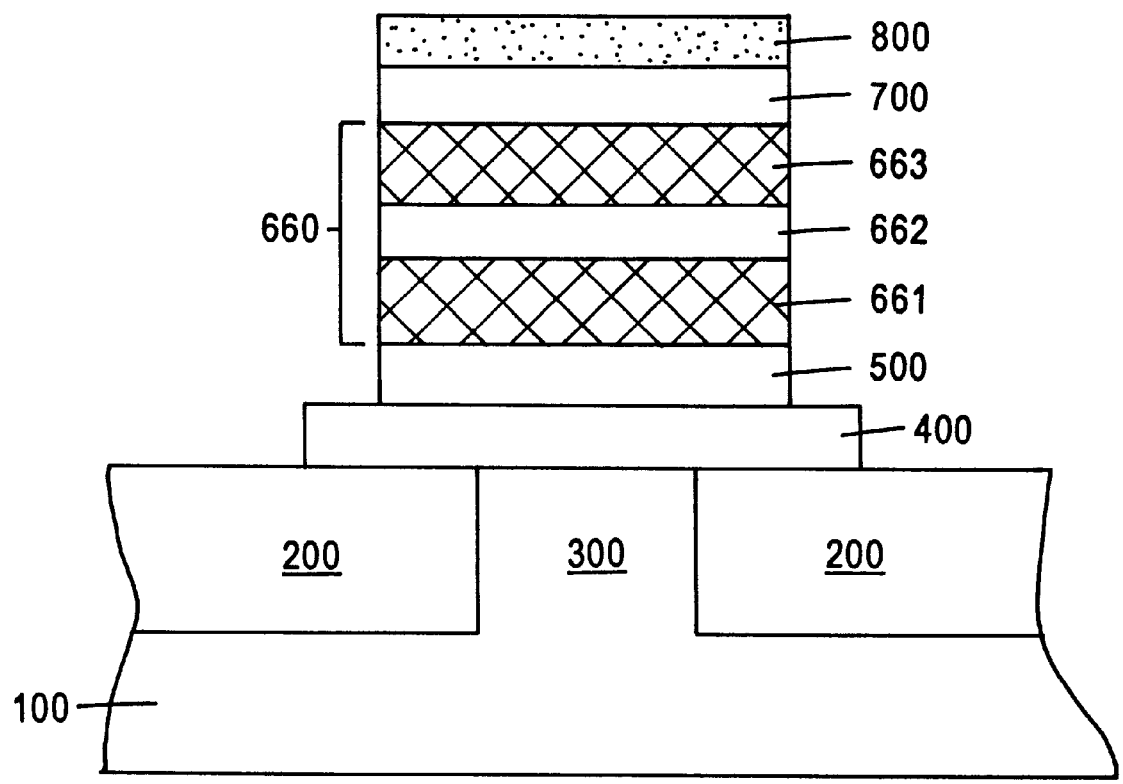
FIG. 3 is a cross-sectional view of a flash memory cell produced in accordance with the methodology of a second embodiment of the present invention.

A semiconductor device produced according to another embodiment of the present invention is depicted in FIG. 3. In this embodiment, both the first oxide layer 661 and the second oxide layer 663 of ONO film 660 comprise a material having a relatively high dielectric constant; e.g., a dielectric constant no less than about 10, such as aluminum oxide, titanium oxide, or tantalum oxide, deposited at a thickness of greater than about 55 Å. The thickness of the first and second oxide layers 661, 663 should be such that the capacitance of composite ONO film 660 falls within the design rule of the device.

The present invention enables widening the cleaning process window, without adverse impact on device performance. In addition, the present invention improves deposition flexibility by enabling deposition of one or both oxide layers 661, 663 of composite ONO film 660 to a thickness greater than the design rule, by utilization of a material with a dielectric constant greater than that of silicon dioxide. Due to the inherent limitations of the deposition process, the control of oxide layer thickness becomes more difficult as dimensions shrink. By enabling thicker and, therefore, more readily and accurately deposited oxide layers to be used in the composite ONO stack, the methodology of the present invention facilitates cost-effective device scaling and allows greater flexibility in oxide deposition.

The present invention can be practiced by employing conventional materials, methodology and equipment. Accordingly, the details of such materials, equipment and methodology are not set forth herein in detail. In the previous descriptions, numerous specific details are set forth, such as specific materials, structures, chemicals, processes, etc., in order to provide a thorough understanding of the present invention. However, it should be recognized that the present invention can be practiced without resorting to the details specifically set forth. In other instances, well known processing structures have not been described in detail, in order not to unnecessarily obscure the present invention.

Only the preferred embodiment of the present invention and but a few examples of its versatility are shown and described in the present disclosure. It is to be understood that the present invention is capable of use in various other combinations and environments and is capable of changes or modifications within the scope of the inventive concept as expressed herein.

What is claimed is:

1. A semiconductor device comprising:
   a tunnel oxide layer on a channel region of a semiconductor substrate;
   a floating gate on the tunnel oxide layer;
   a control gate formed above the floating gate and spaced apart from the floating gate at least a predetermined distance; and
   a composite dielectric layer between the control gate and the floating gate, the dielectric layer comprising:
   a first oxide layer on the floating gate, the first oxide layer having a first thickness;
   a nitride layer on the first oxide layer, the nitride layer having a second thickness; and
   a second oxide layer having a dielectric constant about equal to or greater than 10 and having a third thickness;
   wherein the sum of the first, second and third thicknesses corresponds to at least a minimum design data retention; and
   wherein the first and second oxide layers and the nitride layer have a combined capacitance corresponding to the design rule of the semiconductor device.

2. The semiconductor device according to claim 1, wherein the combined first, second and third thicknesses exceed the design rule of the semiconductor device; and the first and/or second oxide layer comprises an oxide having a dielectric constant greater than that of silicon dioxide.

3. The semiconductor device according to claim 2, wherein the first oxide layer comprises silicon dioxide and the second oxide layer comprises aluminum oxide, titanium oxide or tantalum oxide.

4. The semiconductor device according to claim 3, wherein the third thickness is greater than about 55 Å.

5. The semiconductor device according to claim 1, wherein the first and/or second oxide layers each comprise aluminum oxide, titanium oxide or tantalum oxide, and the nitride layer comprises silicon nitride.

* * * * *